United States Patent [19]
Nishikawa et al.

[11] Patent Number: 5,742,629
[45] Date of Patent: Apr. 21, 1998

[54] SEMICONDUCTOR LASER AND PRODUCTION METHOD THEREOF

[75] Inventors: Takashi Nishikawa, Osaka; Nobuyuki Uemura, Takatsuki; Satoshi Kamiyama, Sanda, all of Japan

[73] Assignee: Matsushita Electric Industrial Co., Ltd., Osaka, Japan

[21] Appl. No.: 684,383

[22] Filed: Jul. 19, 1996

[30] Foreign Application Priority Data

Jul. 21, 1995 [JP] Japan ................... 7-185212

[51] Int. Cl.$^6$ ................................. H01S 3/19
[52] U.S. Cl. .................. 372/46; 257/13; 257/103
[58] Field of Search ............... 372/45, 46; 257/13, 257/79, 103

[56] References Cited

U.S. PATENT DOCUMENTS 5,268,918  12/1993  Akimoto et al. ................ 372/45
5,278,856  1/1994   Migita et al. .................... 372/45
5,375,134  12/1994  Okuyama et al. ............... 372/45
5,521,934  5/1996   Fitzpatrick ...................... 372/45

FOREIGN PATENT DOCUMENTS 7-7183    1/1995  Japan.
7-226562  8/1995  Japan.

*Primary Examiner*—James W. Davie
*Attorney, Agent, or Firm*—Ratner & Prestia

[57] ABSTRACT

A semiconductor laser includes: an active layer formed of a II-VI group compound semiconductor material; a first cladding layer and a second cladding layer disposed so as to put the active layer therebetween; a light confinement layer provided on the second cladding layer, having an opening for current flow and formed of ZnMgSSe; and a third cladding layer provided at the opening of the light confinement layer. The light confinement layer has high resistivity or has a conductivity type opposite to that of the third cladding layer; the second and third cladding layers are formed of ZnMgSSe; and a Mg content and a S content of the light confinement layer are larger than a Mg content and a S content of the second and third cladding layers.

7 Claims, 5 Drawing Sheets

SEMICONDUCTOR LASER AND PRODUCTION METHOD THEREOF

BACKGROUND OF THE INVENTION

1. Field of the Invention

The present invention relates to a semiconductor laser and a production method thereof, and more particularly, to a semiconductor laser which oscillates in a single transverse mode (also referred to as "single mode", hereinafter) and to a production method thereof.

2. Description of the Related Art

A II-VI group semiconductor laser which is capable of continuously oscillating at room temperature is becoming a reality because of the establishment of doping technology of p-type and n-type dopant impurities, the introduction of the quadruple mixed crystalline structure using Mg and the employment of a contact layer using ZnTe. The realization of this semiconductor laser increases the possibility that high quality visual image information can be recorded on a compact-size disk recording medium in the future.

FIG. 1 is a cross-sectional view illustrating the structure of a semiconductor laser 20 according to conventional technology formed with a II-VI group semiconductor In order to produce the semiconductor laser 20, an n-type GaAs buffer layer (about 1 μm thickness) 2, an n-type ZnSe layer (about 30 nm thickness) 3, an n-type ZnMgSSe layer (about 1.2 μm thickness) 4, a ZnSSe layer (about 0.13 μm thickness) 5, a ZnCdSe active layer (about 8 nm thickness) 6, a second ZnSSe layer (about 0.13 μm thickness) 7, a p-type ZnMgSSe layer (about 0.7 μm thickness) 8, a p-type ZnSSe layer (about 0.4 μm thickness) 9, a p-type ZnSe layer (about 0.1 μm thickness) 10, a p-type ZnSeTe layer (about 50 nm thickness) 11, and a p-type ZnTe layer 12 are successively deposited in this order on an n-type GaAs substrate 1 by molecular beam epitaxy. Next, the above layered structure is etched until the p-type ZnMgSSe layer 8 is exposed so that a mesa structure having a stripe shape (also referred to as "mesa stripe" hereinafter) is formed. Then, insulators, for example, ZnS layers 13, are formed on both sides of the mesa stripe formed as above so that the mesa stripe is buried (the layer 13 is also referred to as "burying layer 13" hereinafter). Then, an Au/Pd electrode 15 is formed on the upper surfaces of the mesa stripe (specifically, the p-type ZnTe layer 12 which is the uppermost layer) and the ZnS layers 13 and, furthermore, an In electrode 14 is formed on the rear surface of the n-type GaAs substrate 1, thereby completing the semiconductor laser 20.

In this structure, current confinement is realized by the formation of the mesa stripe within the semiconductor layered structure for laser oscillation and, furthermore, the flattening of the surface of the semiconductor laser 20 is realized by burying the mesa stripe with the burying layers 13. Moreover, light confinement in the transverse direction is realized by using as a constituting material for the burying layers 13, a material (ZnS in the above example) having a refractive index smaller than that of the constituting material (ZnMgSSe in the above example) for the cladding layer included in the semiconductor layered structure for laser oscillation.

On the other hand, FIG. 2 is a cross-sectional view illustrating the structure of another conventional semiconductor laser 30 disclosed in Japanese Laid-Open Patent Publication No. 7-7183. This semiconductor laser 30 is a blue light emitting laser having semiconductor layered structure for laser oscillation formed by epitaxial growth of a ZnCdSSe series II-VI group semiconductor material on an n-type GaAs substrate 31. The semiconductor laser 30 is capable of emitting laser light of short wavelength of about 500 nm.

Specifically, an n-type ZnSe buffer layer 32, an n-type ZnSSe first light confinement layer 33, a ZnCdSe active layer 34, and a p-type ZnSSe second light confinement layer 35 are successively deposited in this order on an n-type GaAs substrate 31. Furthermore, a GaAs current blocking layer 36 provided in the middle with an opening region 36a having a stripe shape is formed on the second light confinement layer 35. A p-type ZnSSe third light confinement layer 37 and a p-type ZnSe contact layer 38 are formed in this order on the current blocking layer 36. Finally, electrodes 39 and 40 are formed on the upper surface of the contact layer 38 and the rear surface of the substrate 31, respectively, thereby completing the semiconductor laser 30.

In the semiconductor laser 30, current L flowing from the electrode 39 to the active layer 34 passes only through the stripe shape opening region 36a when passing through the current blocking layer 36. Because of this, the current L concentrates and flows into the region 34a of the active layer 34, which is opposed to the stripe-shape opening region 36a. As a result, only the region 34a contributes to the laser oscillation. In addition to this concentration effect for the current, by disposing the current blocking layer 36 and the active layer 34 in close proximity, spread of the current within the second light confinement layer 35 is inhibited. As a result, reduction in bias voltage to be applied between the electrodes 39 and 40 is realized in the semiconductor laser 30, resulting in the realization of reduction in power consumption, improvement of temperature dependent characteristics of operation and the like.

Moreover, since there exists a difference in the refractive index between the GaAs constituting the current blocking layer 36 and the II-VI group semiconductor material (ZnSSe) constituting the second and third light confinement layers 35 and 37, there exists a difference in light absorption therebetween. As a result, the stripe shape opening region 36a of the current blocking layer 36 functions as a light waveguide path in the transverse direction. By appropriately adjusting the width of the stripe shape opening region 36a, the spreading condition of light in the transverse direction can be controlled.

There are some problems as described below concerning the conventional semiconductor laser 20 having the structure illustrated in FIG. 1.

First, the burying layer 13 which realizes the current confinement and the transverse mode control is a polycrystalline layer or an amorphous layer. There is a possibility that impurities which are at grain boundaries within the burying layer 13 or are taken in between the thin film layers included in the layered structure for laser oscillation and the burying layer 13 create an abnormal current path. This may pose a problem associated with reliability such as deterioration of current characteristics.

Moreover, since the burying layer 13 is not a single crystalline layer, another single crystalline layer cannot be grown on the burying layer 13. Because of this, a p-type contact layer occupying an area larger than the mesa strip cannot be formed by crystal growth, and reduction in contact resistance which could otherwise be expected cannot be realized.

Furthermore, although the burying depth for realizing the light confinement in the transverse direction, i.e., the height of the mesa stripe is made to be a predetermined height by etching, its control is extremely difficult. Moreover, although it is necessary to make the width of the mesa stripe very small in order to realize the single transverse mode oscillation, it is difficult to form a stripe structure having a sufficiently narrow width using a mask.

In addition, since the p-type electrode and the contact layer included in the semiconductor layered structure for laser oscillation are in contact only in the width of the mesa stripe, the contact area therebetween is small. As a result, very large resistance is produced between the p-type electrode and the active layer.

On the other hand, in the conventional semiconductor laser 30 described with reference to FIG. 2, the contact layer 38 occupying a large area can be formed by crystal growth. Moreover, since the p-type electrode 39 is formed on the contact layer 38 thus formed, resistance between the contact layer 38 and the electrode 39 is reduced. Therefore, the above-described problems can be solved to a certain extent.

However, in the semiconductor laser 30, described with reference to FIG. 2, materials which lattice-match the substrate 31 are used as constituting materials for the semiconductor layered structure to be formed on the substrate 31 except for the active layer 34. This uniquely determines a composition (specifically, $ZnS_{0.04}Se_{0.92}$) of the cladding layer (light confinement layer), denying any degree of freedom in designing the laser structure.

Furthermore, although the current blocking layer 36 is made of GaAs in the structure of the semiconductor laser 30, the GaAs has a band gap of such width that it absorbs the laser light being emitted. Because of this, the semiconductor laser 30 becomes in possession of an optical loss waveguide structure where the current blocking layer 36 absorbs light. Therefore, high output cannot be realized because of the light absorption by the current blocking layer 36.

SUMMARY OF THE INVENTION

According to one aspect of the present invention, a semiconductor laser includes: an active layer formed of a II-IV group compound semiconductor material; a first cladding layer and a second cladding layer disposed so as to put the active layer therebetween; a light confinement layer provided on the second cladding layer, having an opening for current flow and formed of ZnMgSSe; and a third cladding layer provided at the opening of the light confinement layer. The light confinement layer has high resistivity or has a conductivity type opposite to that of the third cladding layer; the second and third cladding layers are formed of ZnMgSSe; and a Mg content and a S content of the light confinement layer are larger than a Mg content and a S content of the second and third cladding layer.

In one embodiment of the present invention, the opening of the light confinement layer is narrowed on the side closer to the active layer.

In one embodiment of the present invention, the semiconductor laser further includes light guiding layers provided between the active layer and the first cladding layer and between the active layer and the second cladding layer.

In one embodiment of the present invention, refractive indices of the second and third cladding layers are larger than a refractive index of the light confinement layer.

In one embodiment of the present invention, the semiconductor laser further includes: a contact layer provided on the third cladding layer; and an electrode provided on the contact layer. The electrode and the contact layer make contact in a device area.

In one embodiment of the present invention, the contact layer includes at least ZnSe.

In one embodiment of the present invention, the semiconductor further includes an etching stopping layer provided between the second cladding layer and the light confinement layer.

According to another aspect of the present invention, a method for producing a semiconductor laser includes the steps of: growing on a substrate a layered structure including at least a first cladding layer, an active layer, a second cladding layer and a light confinement layer; selectively forming a mask on the light confinement layer; etching the light confinement layer using the mask until the second cladding layer is exposed so as to provide an opening in the light confinement layer; growing a third cladding layer at the opening of the light confinement layer so as to fill the opening; and growing a contact layer on the third cladding layer. The active layer is formed on a II-VI group compound semiconductor material; the light confinement layer has high resistivity or has a conductivity type opposite to that of the third cladding layer; the second and third cladding layers and the light confinement layer are formed of ZnMgSSe; and a Mg content and a S content of the light confinement layer are larger than a Mg content and a S content of the second and third cladding layers.

In one embodiment of the present invention, the etching of the light confinement layer is stopped at least within the second cladding layer.

In one embodiment of the present invention, the opening of the light confinement layer is formed such that the opening is narrowed on the side closer to the second cladding layer.

In one embodiment of the present invention, the step of growing the third cladding layer is performed by regrowth so that the third cladding layer experiences thermal hysteresis only once.

In one embodiment of the present invention, the method further includes the steps of: growing an etching stopping layer to be used for stopping the etching of the light confinement layer between the second cladding layer and the light confinement layer; and cleaning a surface of the etching stopping layer exposed by the etching of the light confinement layer. The third cladding layer is grown after the step of cleaning.

In one embodiment of the present invention, the etching stopping layer is formed of a III-V group compound semiconductor material; and the step of cleaning the surface of the etching stopping layer includes the step of irradiating the exposed surface of the etching stopping layer with a plasma including hydrogen.

According to the semiconductor laser of the present invention having the above-described structure and the production method thereof, since the semiconductor layered structure for laser oscillation is formed by crystal growth, the thicknesses of the light confinement layer and the cladding layer which are included in the layered structure can be set at a predetermined value by controlling the crystal growth process, not by controlling the etching process. Because of this, a light confinement structure having predetermined design parameters can be formed with excellent reproducibility.

Moreover, since the opening in the light confinement layer is formed in such a manner that the opening is narrower to the active layer side, the width of the mask used to form the opening may be larger than the effective width of the mesa stripe contributing to the current confinement. Therefore, a mesa stripe having a small width can easily be formed.

Furthermore, the third cladding layer, the contact layer and the electrode make contact in the device area, not in the width of the mesa stripe. Because of this, resistance produced between the electrode and the cladding layer is considerably reduced.

It is only necessary that the etching for forming the opening in the light confinement layer is stopped at least within the second cladding layer. Therefore, this etching process can easily be controlled.

Alternatively, when an etching stopping layer is provided between the second cladding layer and the light confinement layer, the above etching steps for forming the opening can be controlled more easily. Furthermore, when this etching stopping layer is formed of a III-V group semiconductor material, then the etched surface exposed by the etching for forming the opening can be easily cleaned and smoothed, and the third cladding layer can easily be regrown thereon. When hydrogen plasma is used for cleaning and smoothing the surface of the etching stopping layer prior to the above-mentioned regrowth, then the cleaning and flattening processing can be performed at a temperature relatively lower than the growth temperature for the third cladding layer. Therefore, adverse effects of heat on the semiconductor layered structure can be reduced.

When the third cladding layer is formed by regrowth, adverse effects regarding non-activation of carriers in the p-type cladding layer due to heat can be reduced.

Moreover, since the light confinement layer which performs current confinement is a single crystalline layer continuously formed within the semiconductor layered structure, a possibility that a phenomenon which could adversely affect operational characteristics such as undersirable leakage current is reduced.

Furthermore, in the semiconductor laser according to the present invention, the light confinement layer which also functions as the current blocking layer is made of ZnMgSSe which is a quadruple mixed crystal II-VI group compound semiconductor material. Since this material has a large band gap compared with the wavelength of the oscillated laser light, the oscillated laser light is not absorbed thereby. Thus, a refractive index waveguide type laser structure is realized. Therefore, the threshold current can be made small to such an extent that the absorption of laser light does not occur and laser oscillation up to a high output range can be achieved.

Moreover, by increasing the refractive indices of the second and third cladding layers compared with the refractive index of the light confinement layer, an effective refractive index difference Δn in the horizontal direction can be provided to the active layer. In the semiconductor laser according to the present invention, by appropriately controlling this effective refractive index difference Δn, single transverse mode oscillation is realized. In doing so, the cladding layer and the light confinement layer are formed of quadruple semiconductor materials. Since the quadruple mixed crystal semiconductor materials include a number of materials whose composition allows lattice match with the substrate, a composition (material) which realizes both the lattice-matching with the substrate and the creation of an appropriate effective refractive index difference can be easily selected. This results in a large degree of freedom in designing semiconductor lasers.

Thus, the invention described herein makes possible the advantages of (1) providing a II-VI group semiconductor laser which has a small threshold current value and is capable of single transverse mode oscillation, and (2) providing a production method thereof.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of a semiconductor laser according to the present invention and a production method thereof will be described with reference to the accompanying figures.

Figure 3A:
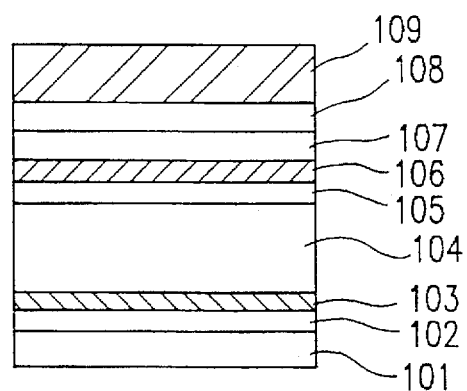
FIGS. 3A to 3C are cross-sectional views illustrating the structure of a semiconductor laser according to the present invention and production steps therefor.
Figure 3B:
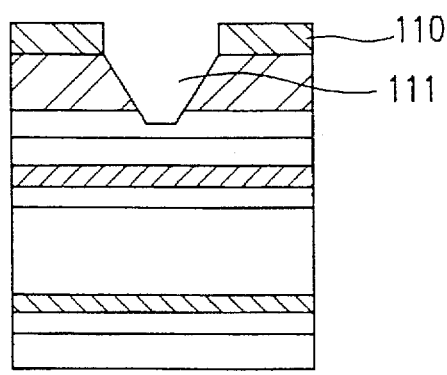
Figure 3C:
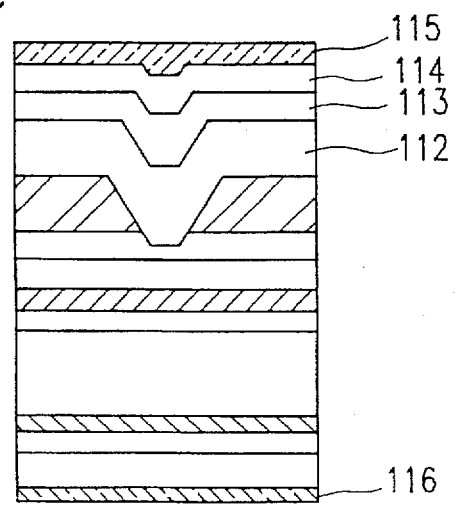

FIGS. 3A to 3C are cross-sectional views illustrating the structure and production steps of a semiconductor laser 100 according to one embodiment of the present invention.

In order to produce the semiconductor laser 100, an n-type GaAs buffer layer 102, an n-type ZnSe buffer layer 103, an n-type ZnMgSSe first cladding layer 104, a ZnSSe first light guiding layer 105, a multi-quantum well layer (an active layer) 106, a ZnSSe second light guiding layer 107, a p-type ZnMgSSe second cladding layer 108, and a ZnMgSSe light confinement layer 109 are successively deposited in this order on an n-type GaAs substrate 101 as shown in FIG. 3A. Specifically, each of the above-mentioned layers is successively epitaxially grown on the substrate 101 using molecular beam epitaxy (MBE). As materials for this MBE growth, for example, a ZnSe compound source, a ZnS compound source, a ZnTe compound source and a Mg metal source are used. The purity of each is set, for example, at 99.9999% or above.

Next, a mask 110 is selectively formed on this layered structure as illustrated in FIG. 3B. The mask 110 has an opening at a location corresponding to a groove 111 which is to be formed later.

Next, the light confinement layer 109 is etched using the mask 110 to form a groove 111. As a material for the mask 110, for example, a resist film, a silicon oxide film, or a silicon nitride film can be used. Any of these films is formed in a predetermined stripe shape to be used as the mask 110.

The etching to form the groove 111 is performed with, for example, dichromate type etchant or saturated bromine water type etchant. The dichromate type etchant here is a mixture of dichromate acid aqueous solution and concentrated sulfuric acid, whose mixing ratio is, for example, 2 to 1. The saturated bromine water type etchant is a mixture of saturated bromine water, water and phosphoric acid, whose mixing ration is, for example, 2 to 15 to 1.

Since the above-mentioned etchant is an anisotropic etchant, the groove 111 is formed in a mesa shape. That is, the area of the bottom of the groove 111 close to the active layer 106 (or the second cladding layer 108) is smaller than the area of the upper part of the groove 111 corresponding to the opening of the mask 110. The etching for forming the groove 111 can be stopped anywhere in the range of thickness of the p-type ZnMgSSe second cladding layer 108.

Next, the mask 110 is removed, and a p-type ZnMgSSe third cladding layer 112 is formed on the second cladding layer 108 and the light confinement layer 109 so as to fill the groove 111. Furthermore, a p-type ZnSSe cladding layer 113 and a p-type ZnSe contact layer 114 are successively deposited in this order on the third cladding layer 112. The above-mentioned third cladding layer 112, the cladding layer 113 and the contact layer 114 are all made of materials having a composition which is the same as or close to the composition of the second cladding layer 108 and the layers 112, 113 and 114 are formed by crystal growth using an MBE apparatus.

Then, a p-type electrode 115 is formed on the p-type contact layer 114 by, for example, deposition. The p-type electrode 115 can be made of Pd/Au or Cr/Au. On the other hand, an n-type electrode 116 is formed on the rear surface of the n-type GaAs substrate 101. The n-type electrode 116 can be made to be an In electrode or a Ni/AuGe/Ni/Au electrode.

This completes the semiconductor laser 100 of this embodiment having the structure illustrated in FIG. 3C.

In the structure of the above-described semiconductor laser 100, Cl, for example, is used as an n-type dopant for the n-type ZnSe buffer layer 103 and the n-type ZnMgSSe first cladding layer 104. This Cl doping can be performed using, for example $ZnCl_2$ of 99.9999% purity as a doping material. On the other hand, the doping of the p-type impurity for the p-type ZnMgSSe second cladding layer 108, the p-type ZnMgSSe third cladding layer 112, the p-type ZnSSe cladding layer 113 and the p-type ZnSe contact layer 114 can be performed, for example, by introducing N during the crystal growth in the form of an $N_2$ plasma.

The etching for providing the groove 111 in the light confinement layer 109 is performed until the second cladding layer 108 is exposed. Specifically, it is only necessary that the etching is stopped when the etching front is within the second cladding layer 108 as previously described. Alternatively, in order to facilitate the control of the etching, an etching stopping layer may be disposed between the second cladding layer 108 and the light confinement layer 109. The etching stopping layer in this case can be formed, for example, of p-type GaAs of an impurity concentration of about $1 \times 10^{-3}$ cm$^{-3}$ and a thickness of about 10 nm. It is also possible to use, for example, p-type AlGaAs or p-type InGaAs as the etching stopping layer.

Next, each of the semiconductor layers included in the semiconductor laser 100 will be described in greater detail hereinafter.

The n-type ZnSe buffer layer 103 is introduced in order to prevent the deterioration of the crystalline surface obtained by the crystal growth, which could be caused by the direct attachment of sulfur (S) or magnesium (Mg) to the GaAs substrate 101 during the initial stage of the crystal growth. A thickness of the ZnSe buffer layer 103 is set to be the critical thickness (about 800 Å) or less which is determined in relation to the lattice mismatch between ZnSe and GaAs. Alternatively, the ZnSe buffer layer 103 may be omitted.

A composition of the n-type ZnMgSSe first cladding layer 104 is such that when expressed as $Zn_{1-x}Mg_xS_ySe_{1-y}$, the values for x and y are set to be in the ranges of x=0.10 to 0.26 and y=0.1 to 0.28, respectively, and are selected so that the lattice constant of the ZnMgSSe matches that of the GaAs and at the same time the doping concentration and the band gap have optimum values. For example, the x and y are set at x=0.17 and y=0.20, respectively. Moreover, a thickness of the first cladding layer 104 is set at about 2 μm or less, for example, at about 1 μm. On the other hand, the impurity concentration is set such that a difference between the donor concentration Nd and the accepter concentration Na is, for example, about $4 \times 10^{17}$ cm$^{-3}$.

A thickness of the ZnSSe first light guiding layer 105 is set, for example, at about 700 Å. Its composition is selected such that the lattice constant of the ZnSSe matches that of the GaAs. For example, when expressed as $ZnS_zSe_{1-z}$, the z is set at z=0.06.

The active layer 106 has a multi-quantum well structure where a ZnCdSe layer having, for example, a thickness of about 70 Å is used as a well layer and a ZnSe layer having, for example, a thickness of about 100 Å is used as a barrier layer. The number of well layers which are disposed between the two barrier layers at the top and the bottom to be repeatedly formed therebetween are, for example, five. Alternatively, it is acceptable to have a structure where there is only one well layer. Furthermore, another multi-quantum well structure can be used where a ZnSe layer is used as the well layer and a ZnMgSSe layer is used as the barrier layer. The oscillation wavelength becomes about 450 nm for this combination of the ZnSe layer and the ZnMgSSe layer. Thus, the oscillation wavelength can be made shorter than that in the case where the ZnCdSe layer is used.

A thickness of the ZnSSe second light guiding layer 107 is made to be, for example, about 700 Å. Moreover, its composition is selected such that the lattice constant of the ZnSSe matches that of the GaAs. For example, when expressed as $ZnS_zSe_{1-z}$, Z is set at z=0.06.

The composition of the second cladding layer 108 made of p-type ZnMgSSe is such that when expressed as $Zn_{1-x}Mg_xS_ySe_{1-y}$, x and y are set, for example, at x=0.17 and y=0.20, respectively. Moreover, its thickness is set at about 0.2 μm or less, or for example, at about 0.1 μm. The dopant impurity concentration is set, for example, at about $1 \times 10^{17}$ cm$^{-3}$.

As already described, the groove (i.e., the opening) 111 is formed in the ZnMgSSe light confinement layer 109 using the mask 110 made of the stripe shape resist film or $SiO_2$ film. The width of the opening 111 at the top, i.e., the stripe width of the mask 110 used to form the groove (the opening) 111 is set, for example, at about 5 μm. Moreover, the digging depth to be achieved in the etching process for forming the groove (the opening) 111 in the case where the beforementioned etching stopping layer is not used is larger than the thickness of the ZnMgSSe light confinement layer 109, and is set such that the bottom of the groove 111 comes within the p-type ZnMgSSe second cladding layer 108. Therefore, strict control over the etching process is not required.

For example, the ZnMgSSe light confinement layer 109 may not be doped at all and have high resistivity. Alternatively, i may be of an n-type which is the opposite conductivity type to that of the third cladding layer 112 (p-type). In the case where it is doped to n-type, the carrier concentration is set, for example, at about $1 \times 10^{10}$ cm$^{-3}$.

The p-type ZnSe contact layer 114 has an impurity concentration, for example, of about $4 \times 10^{17}$ cm$^{-3}$. The thickness is set, for example, at about 0.8 µm.

Alternatively, a p-type ZnTe contact layer can be further provided in addition to the p-type ZnSe contact layer 114 so that the contact layer becomes a multi-layer structure. In such a multi-layer contact structure, contact resistance is reduced. In order to form such a structure, the p-type ZnSe contact layer 114 is first formed with an impurity concentration, for example, of about $1 \times 10^{18}$ cm$^{-3}$ and a thickness, for example, of 0.3 µm. Then, a p-type ZnSe/ZnTe multi-quantum well (MQW) layer and a p-type ZnTe second contact layer having an impurity concentration, for example, of about $5 \times 10^{18}$ cm$^{-3}$ and a thickness, for example, of about 80 Å are grown thereon by MBE (these layers not shown in the figure). Then, the p-type electrode 115 is deposited on the second contact layer. The doping of a p-type impurity to the p-type ZnTe/ZnSe multi-quantum well layer and the p-type ZnTe second contact layer which are additionally provided as above can be performed by introducing N, for example, in the form of an $N_2$ plasma in the crystal growth process.

Furthermore, in the semiconductor laser 100 described above, ZnSSe which is used for the light guiding layer can be used instead of ZnMgSSe as a constituting material for the cladding layer. Alternatively, it is also possible to have a structure where the light guiding layer made of ZnSSe is omitted and the active layer is sandwiched only with the cladding layers made of ZnMgSSe.

The semiconductor laser 100 according to the present invention described above can be constituted in such a manner that it has a refractive index wave guide type structure. In order to realize such a structure, a composition of the ZnMgSSe light confinement layer 109 is made, for example, to be $Zn_{0.81}Mg_{0.19}S_{0.22}Se_{0.78}$ and a composition of both the p-type ZnMgSSe second cladding layer 108 and the p-type ZnMgSSe third cladding layer 112 are made, for example, to be $Zn_{0.83}Mg_{0.17}S_{0.2}So_{0.8}$. Because of this structure, an effective refractive index difference Δn for the active layer 106, i.e., a difference between the effective refractive index in the region of the active layer 106 corresponding to the groove (the opening) 111 of the light confinement layer 109 and that of other regions within the active layer 106 becomes about $4 \times 10^{-3}$, thereby realizing the refractive index waveguide type structure. In such refractive index waveguide type structure, single transverse mode oscillation becomes possible and a current confinement structure is realized. Furthermore, heat generated in the active layer 106 can be absorbed by the third cladding layer 112 filling the opening 111 in the light confinement layer 109.

The above-mentioned effective refractive index difference Δn is determined by a difference between the refractive index of the second and third cladding layers 108 and 112, respectively, and that of the light confinement layer 109, as well as by a ratio of the thickness of the second cladding layer 108 remaining between the light confinement layer 109 and the active layer 106 (referred to as "remaining thickness t", hereinafter) to the thickness of the light confinement layer 109. According to the present invention, thicknesses of the second and third cladding layers 108 and 112, respectively, or the light confinement layer 109 are determined by the crystal growth process, not by the etching process. Therefore, it is possible to strictly control these thicknesses. As a result, a semiconductor laser capable of single transverse mode oscillation can be realized with high accuracy and excellent reproducibility.

In order to realize single transverse mode oscillation in the refractive index waveguide structure, it is preferable to set the above-mentioned effective refractive index difference Δn in the range of $5 \times 10^{-3}$ to $1 \times 10^{-2}$. The above range represents the typical values for the effective refractive index difference Δn in the case where: a composition of the second and third cladding layers 108 and 112 is set such that when expressed as $Zn_{1-x}Mg_xS_ySe_{1-y}$, x and y are in the range of x=0.06 to 0.1 and y=0.14 to 0.28 so as to make the band gap ΔEg to be about 2.8 eV; a composition of the light confinement layer 109 which also functions as the current blocking layer is set such that when expressed as $Zn_{1-x}Mg_xS_ySe_{1-y}$, x and y are in the range of x=0.09 to 0.15 and y=0.18 to 0.28 so as to make the band gap ΔEg to be about 3.0 eV; and the remaining thickness t of the second cladding layer 108 is set in the range of about 0.1 µm to about 0.5 µm.

The ZnMgSSe cladding layer whose band gap ΔEg is about 2.8 eV is a typical cladding layer to be used in the structure of a II-VI group compound semiconductor laser, in which doping of p-type and n-type dopant impurities thereto can be adequately performed and light confinement in the longitudinal direction therein can be realized.

On the other hand, although it is generally necessary to increase a Mg content in order to increase the band gap of the ZnMgSSe layer, the doping efficiency decreases as the Mg content increases. However, since the ZnMgSSe light confinement layer whose band gap ΔEg is about 3.0 eV is a layer which does not require doping, it can be relatively easily formed.

By combining a cladding layer and a light confinement layer having the above-described compositions respectively so that the effective refractive index difference Δn of the active layer takes a value in the above-described range, single transverse mode laser oscillation in the refractive index waveguide type (real index guide type) structure is realized.

In order to set the effective refractive index difference Δn of the active layer 106 at a value in the above-described range for realizing single transverse mode oscillation, it is necessary to make a thickness h of the light confinement layer 109 to be about 0.1 µm or greater. However, if the thickness h of the light confinement layer 109 is greater than about 1.0 µm, then a step at the groove 111 becomes too large, which deteriorates the crystallinity of a crystalline layer regrowing on the light confinement layer 109 so as to fill the groove 111. Furthermore, because of the step which is too large, a relatively large concavity will be formed on the outermost surface of the semiconductor laser device, and this results in a gap when mounted on a chip carrier. As a result, problems associated with deterioration of the heat radiation characteristic, difficulty in bonding and the like occur.

Compositions of the second and third cladding layers 108 and 112, both being made of ZnMgSSe, are preferably made to be the same. However, the compositions are not limited as such.

The light confinement layer 109 and the p-type ZnMgSSe second cladding layer 108 corresponding to a remaining thickness of a cladding layer in a typical laser structure are both formed in the first crystal growth. Therefore, the thicknesses of these layers are determined more strictly than in the case when they are determined by etching.

In the burying type semiconductor laser 100 of the present invention having the structure described with reference to FIGS. 3A to 3C, current confinement is achieved by the semi-groove (the opening) 111 provided in the light confinement layer 109. Therefore, the p-type electrode 115 and the p-type ZnSe contact layer 114, the p-type ZnSe contact layer 114 and the p-type ZnSSe cladding layer 113, and the p-type ZnSSe cladding layer 113 and the p-type ZnMgSSe third cladding layer 112, respectively, make contact in the device area. As a result, resistance produced in the vertical direction (direction between the electrodes) in the semiconductor layered structure becomes considerably small compared to the structure of conventional technology.

In order to obtain sufficient current confinement effect, it is necessary to make the remaining thickness t which is the thickness of the second cladding layer existing under the light confinement layer 109 to be about 0.5 µm or less. If the remaining thickness t is greater than about 0.5 µm, then a distance between the bottom of the groove 111 and the active layer 106 becomes too large, and current spreads excessively. If the remaining thickness t becomes too small, then the effective refractive index difference Δn in the active layer 106 becomes too large, and there arises a possibility that control over the transverse mode laser oscillation becomes difficult. This problem, however, can be overcome by setting the composition of ZnMgSSe constituting the light confinement layer 109 and the thickness h of the light confinement layer 109 at appropriate values within the above-described ranges.

Figure 4:
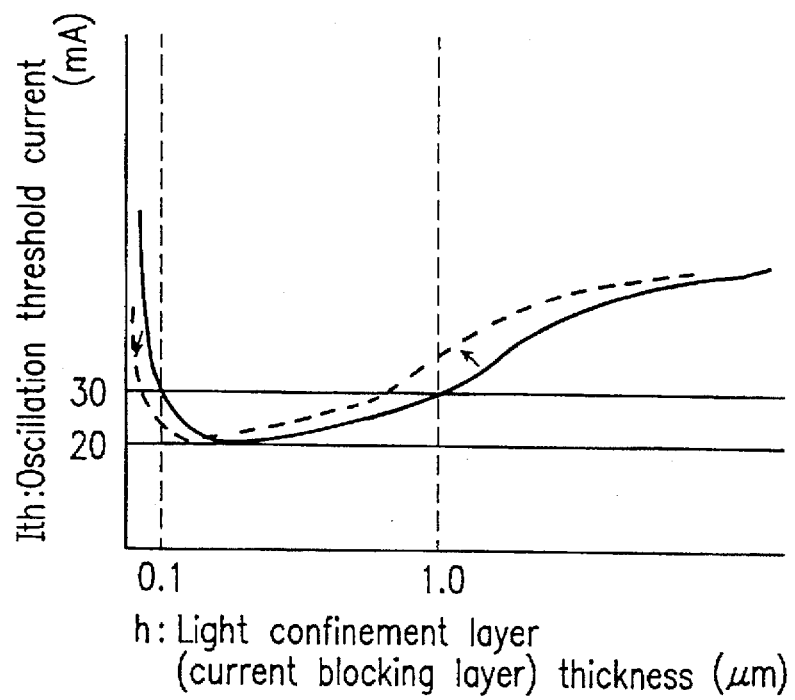
FIG. 4 is a graph illustrating a relationship between a thickness of the light confinement layer and a threshold current for laser oscillation.
Figure 5:
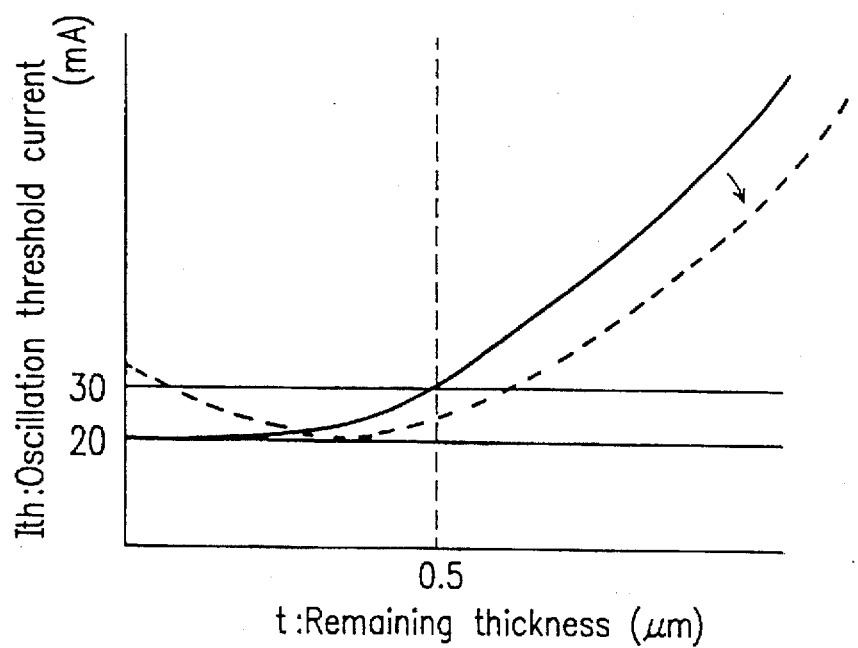
FIG. 5 is a graph illustrating a relationship between the remaining thickness of the second cladding layer and a threshold current for laser oscillation.

FIG. 4 is a graph illustrating a relationship between the thickness of the light confinement layer and the threshold current for laser oscillation in the case where a composition of the second and third cladding layers 108 and 112, respectively, is such that when expressed as $Zn_{1-x}Mg_xS_ySe_{1-y}$, x and y are set at x=0.08 and y=0.18, and a composition of the light confinement layer 109 is such that when expressed as $Zn_{1-x}Mg_xS_ySe_{1-y}$, x and y are set at x=0.11 and y=0.24. FIG. 5 is a graph illustrating a relationship between the remaining thickness of the second cladding layer and the threshold current for laser oscillation for the same composition.

In FIG. 4, when a Mg content in the light confinement layer 109 is increased so that both the band gap ΔEg and the effective refractive index difference Δn in the active layer 106 becomes large, then the characteristic shifts from that illustrated by a solid line to that illustrated by a broken line. In this case, since the refractive index of the light confinement layer 109 becomes small, even if the thickness of the light confinement layer 109 is further made small, a sufficient value for the effective refractive index difference Δn can be obtained. This results in a decrease in the threshold current for laser oscillation.

Also in FIG. 5, when a Mg content in the light confinement layer 109 is increased so that both the band gap ΔEg and the effective refractive index difference Δn in the active layer 106 becomes large, then the characteristic shifts from that illustrated by a solid line to that illustrated by a broken line. In this case, since the refractive index of the light confinement layer 109 becomes small, even if the remaining thickness of the second cladding layer 108 is increased, a sufficient value for the effective refractive index difference Δn can be obtained. However, if the remaining thickness is too small, then the effective refractive index difference Δn becomes too large and control over the transverse mode laser oscillation becomes difficult, resulting in the increased threshold current for laser oscillation.

Next, a difference in the contact area between the p-type electrode and the p-type contact layer and a difference in the current path will be described with respect to the semiconductor laser according to the present invention and the semiconductor laser according to conventional technology with reference to FIGS. 6A and 6B.

Figure 1:
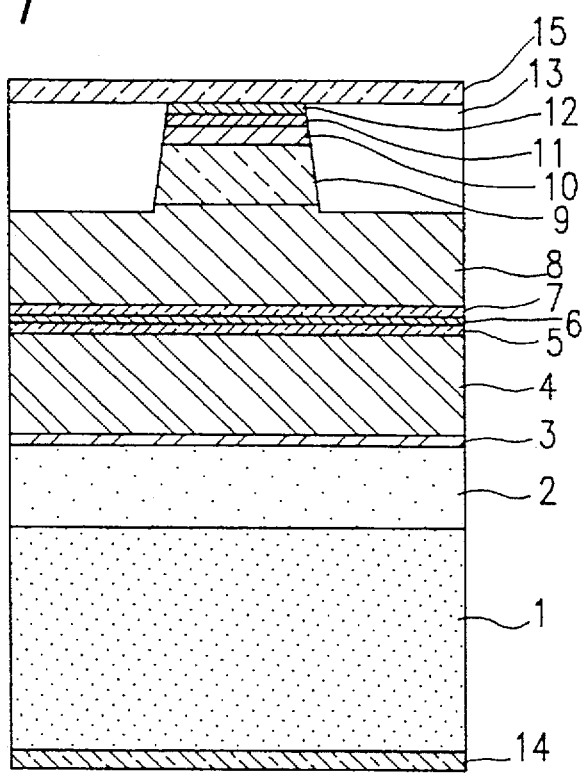
FIG. 1 is a cross-sectional view illustrating the structure of a semiconductor laser according to conventional technology.
Figure 2:
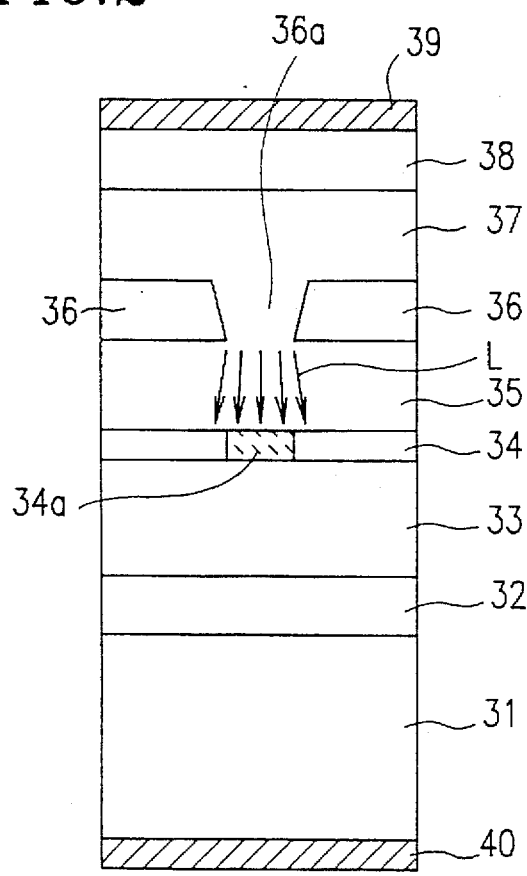
FIG. 2 is a cross-sectional view illustrating the structure of another semiconductor laser according to conventional technology.
Figure 6A:
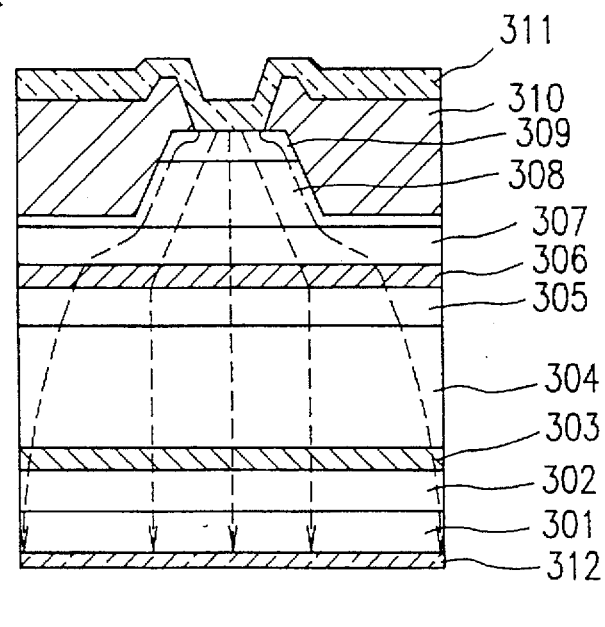
FIG. 6A is a cross-sectional view illustrating the structure of a semiconductor laser according to conventional technology, which schematically illustrates a contact area between the contact layer and the electrode and a current path.
Figure 6B:
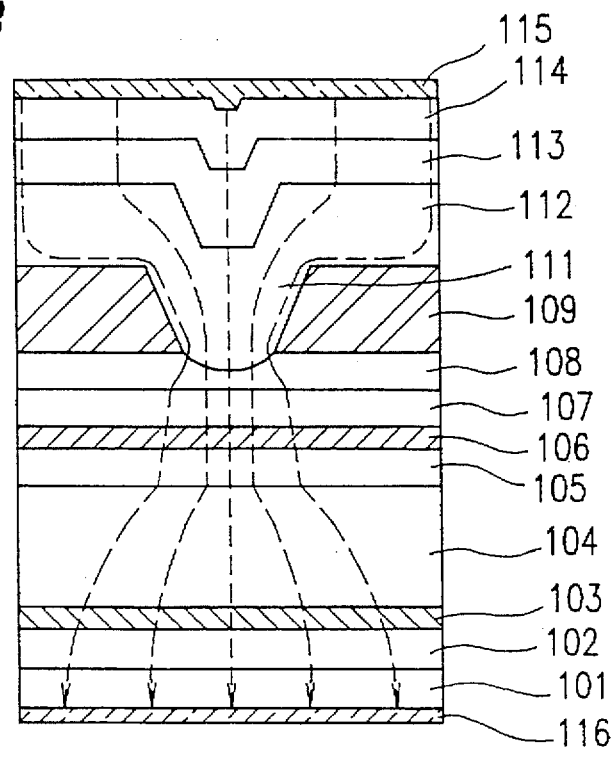
FIG. 6B is a cross-sectional view illustrating the structure of a semiconductor laser according to the present invention, which schematically illustrates a contact area between the contact layer and the electrode and a current path.

FIG. 6A is a cross-sectional view illustrating the structure of the semiconductor laser 300 produced by conventional technology, and FIG. 6B is a cross-sectional view illustrating the structure of the semiconductor laser 100 according to the present invention previously descried with reference to FIGS. 1A to 1C. In FIG. 6B, the same constituent elements as before are designated by the same reference numerals and the descriptions thereof are omitted. In the conventional semiconductor laser 300 shown in FIG. 6A, an n-type GaAs buffer layer 302, an n-type ZnSe buffer layer 303, an n-type ZnMgSSe first cladding layer 304, a ZnSSe first light guiding layer 305, a CdZnSe active layer 306, a ZnSSe second light guiding layer 307, a p-type ZnMgSSe second cladding layer 308, and a p-type contact layer 309 are successively formed in this order on an n-type GaAs substrate 301. Then, the p-type ZnMgSSe second cladding layer 308 and the p-type contact layer 309 are etched to form a mesa stripe. Then, the mesa stripe is buried with a ZnMgSSe layer 310, and a p-type electrode 311 is further formed on the burying layer 310. On the other hand, an n-type electrode 312 is formed on the rear surface of the n-type GaAs substrate 301, thereby completing the semiconductor laser 300.

Structures of the conventional semiconductor laser 300 described above and the semiconductor laser 100 according to the present invention will be compared. When the comparison is carried out, the following is assumed: the length of a side which is parallel with the mesa stripe or the groove 111 in the light confinement layer 109 (both referred to as a "stripe", hereinafter) is measured as about 350 µm; the laser occupies a device area such that the length of a side perpendicular to the stripe is measured as about 700 µm; and the width of the stripe is measured as about 5 µm.

In the structure of the semiconductor laser 300 according to conventional technology shown in FIG. 6A, the contact area between the p-type electrode 311 and the p-type contact layer 309 is about 1750 µm². On the other hand, in the structure of the semiconductor laser 100 according to the present invention shown in FIG. 6B, the contact area between the p-type electrode 115 and the p-type contact layer 114 becomes about 245000 µm², which is about 140 times the value obtainable by conventional technology. Therefore, according to the present invention, resistance produced between the p-type electrode and the p-type contact layer can be made to be about 1/140 of the value for the semiconductor laser 300 which has the corresponding structure formed by conventional technology. Furthermore, resistance in the longitudinal direction between the p-type contact layer and the p-type cladding layer can also be reduced significantly.

Furthermore, in the semiconductor laser 300 according to conventional technology shown in FIG. 6A, current flowing from the p-type electrode 311 to the n-type electrode 312 (indicated by broken lines in the figure) spreads in the entire device region. However, in the semiconductor laser 100 according to the present invention, current flowing in from the p-type electrode 115 (indicated by broken lines in the figure) is narrowed by the groove (the opening) 111 in the light confinement layer 109 and then flows into the active layer 106. Because of this, a region of the active layer 106 where the current actually flows does not become broader than the width of the mask used to form the stripe, i.e., the groove 111 in the light confinement layer 109. This is considerably effective in reducing the threshold current for laser oscillation.

As described above, since the semiconductor layered structure for laser oscillation in the semiconductor laser and the production method thereof according to the present invention is formed by crystal growth, the thicknesses of the light confinement layer and the cladding layer which are included in the layered structure can be set at a predetermined value by controlling the crystal growth process, not by controlling the etching process. Because of this, a light confinement structure having predetermined design parameters can be formed with excellent reproducibility.

Moreover, in the semiconductor laser according to the present invention, the light confinement layer is formed by crystal growth, and is neither a polycrystalline layer nor an amorphous layer. Therefore, gain boundaries do not exist within the light confinement layer, nor are impurities taken into the interface between the layered structure for laser oscillation and the light confinement layer. Thus, it is not the case that current leaks because of the inconvenience described above, which could adversely affect operational characteristics.

Moreover, since the opening in the light confinement layer is formed in such a manner that the opening is narrower to the active layer side, the width of the mask used to form the opening may be larger than the effective width of the mesa stripe contributing to the current confinement. Therefore, a mesa stripe having a small width can easily be formed.

Furthermore, the third cladding layer, the contact layer and the electrode make contact in the device area, not in the width of the mesa stripe. Because of this, resistance produced between the electrode and the cladding layer is considerably reduced.

It is only necessary that the etching for forming the opening in the light confinement layer is stopped at least within the second cladding layer. Therefore, this etching process can easily be controlled.

Alternatively, when an etching stopping layer is provided between the second cladding layer and the light confinement layer, the above etching steps for forming the opening can be controlled more easily. Furthermore, when this etching stopping layer is formed of a III-V group semiconductor material, then the etched surface exposed by the etching for forming the opening can be easily cleaned and smoothed, and the third cladding layer can easily be regrown thereon. When hydrogen plasma is used for cleaning and smoothing the surface of the etching stopping layer prior to the above-mentioned regrowth, then the cleaning and flattening process can be performed at a temperature relatively lower than the growth temperature for the third cladding layer. Therefore, adverse effects of heat on the semiconductor layered structure can be reduced.

When the third cladding layer is formed by the regrowth, adverse effects of non-activation of carriers in the p-type cladding layer due to heat can be reduced.

Moreover, since the light confinement layer which performs current confinement is a single crystalline layer continuously formed within the semiconductor layered structure, a possibility that a phenomenon which could adversely affect operational characteristics such as undesirable leakage current is reduced.

Furthermore, in the semiconductor laser according to the present invention, the light confinement layer which also functions as the current blocking layer is made of ZnMgSSe which is a quadruple mixed crystal II-VI group compound semiconductor material. Since this material has a large band gap compared with the wavelength of the oscillated laser light, the oscillated laser light is not absorbed thereby. Thus, a refractive index waveguide type laser structure is realized. Therefore, the threshold current can be made small to such an extent that the absorption of laser light does not occur and laser oscillation up to high output range can be achieved.

Moreover, by increasing the refractive indices of the second and third cladding layers compared with the refractive index of the light confinement layer, an effective refractive index difference $\Delta n$ in the horizontal direction can be provided to the active layer. In the semiconductor laser according to the present invention, by appropriately controlling this effective refractive index difference $\Delta n$, single transverse mode oscillation is realized. In doing so, the cladding layer and the light confinement layer are formed of quadruple semiconductor materials. Since the quadruple mixed crystal semiconductor materials include a number of materials whose composition allows a lattice match with the substrate, a composition (material) which realizes both the lattice-matching with the substrate and the creation of an appropriate effective refractive index difference can be easily selected. This results in a large degree of freedom in designing semiconductor lasers.

As described above, according to the present invention, a semiconductor laser which excels in lasing characteristics and reliability, and which has little fluctuation in lasing characteristics among samples can be produced with excellent reproducibility.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser, comprising:
   an active layer formed of a II-VI group compound semiconductor material;
   a first cladding layer and a second cladding layer disposed so as to put said active layer therebetween;
   a light confinement layer provided on said second cladding layer, having an opening for current flow and formed of ZnMgSSe; and
   a third cladding layer provided at said opening of said light confinement layer,
   wherein: said light confinement layer has high resistivity or has a conductivity type opposite to that of said third cladding layer;
   said second and third cladding layers are formed of ZnMgSSe; and
   a Mg content and a S content of said light confinement layer are larger than a Mg content and a S content of said second and third cladding layers.

2. The semiconductor laser according to claim 1, wherein said opening of said light confinement layer is narrowed on the side closer to said active layer.

3. The semiconductor laser according to claim 1, further comprising light guiding layers provided between said active layer and said first cladding layer and between said active layer and said second cladding layer.

4. The semiconductor laser according to claim 1, wherein refractive indices of said second and third cladding layers are larger than a refractive index of said light confinement layer.

5. The semiconductor laser according to claim 1, further comprising:

a contact layer provided on said third cladding layer; and an electrode provided on said contact layer, wherein said electrode and said contact layer make contact in a device area.

6. The semiconductor laser according to claim 5, wherein said contact layer includes at least ZnSe.

7. The semiconductor laser according to claim 1, further comprising an etching stopping layer provided between said second cladding layer and said light confinement layer.

* * * * *